US 011846013B2

(12) United States Patent
Gunther et al.

(10) Patent No.: US 11,846,013 B2
(45) Date of Patent: Dec. 19, 2023

(54) METHODS AND APPARATUS FOR EXTENDED CHAMBER FOR THROUGH SILICON VIA DEPOSITION

(71) Applicant: APPLIED MATERIALS, INC., Santa Clara, CA (US)

(72) Inventors: David Gunther, Santa Clara, CA (US); Jiao Song, Singapore (SG); Kirankumar Neelasandra Savandaiah, Bangalore (IN); Irena H. Wysok, San Jose, CA (US); Anthony Chih-Tung Chan, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 123 days.

(21) Appl. No.: 16/945,491

(22) Filed: Jul. 31, 2020

(65) Prior Publication Data

US 2022/0033956 A1 Feb. 3, 2022

(51) Int. Cl.
*H01J 37/34* (2006.01)
*C23C 14/16* (2006.01)
(Continued)

(52) U.S. Cl.
CPC .......... *C23C 14/165* (2013.01); *C23C 14/351* (2013.01); *C23C 14/50* (2013.01); *C23C 14/56* (2013.01); *H01J 37/3455* (2013.01); *H01J 37/3458* (2013.01); *H01L 21/76898* (2013.01); *H01J 37/3405* (2013.01)

(58) Field of Classification Search
CPC ..... C23C 14/165; C23C 14/35; C23C 14/351; C23C 14/50; C23C 14/56; H01J 37/3405; H01J 37/345; H01J 37/3452; H01J 37/3455; H01J 37/3458; H01J 37/32642;
(Continued)

(56) References Cited

U.S. PATENT DOCUMENTS 6,627,050 B2 9/2003 Miller et al.
6,852,202 B2 2/2005 Miller et al.
(Continued)

FOREIGN PATENT DOCUMENTS

CN 107068599 A 8/2017
JP 04-074861 * 3/1992

OTHER PUBLICATIONS

International Search Report for PCT/US2021/043624, dated Nov. 17, 2021.

*Primary Examiner* — Rodney G McDonald
(74) *Attorney, Agent, or Firm* — MOSER TABOADA (57) ABSTRACT

An apparatus leverages a physical vapor deposition (PVD) process chamber with a wafer-to-target distance of approximately 400 millimeters to deposit tantalum film on through silicon via (TSV) structures. The PVD process chamber includes a source that is configured with dual magnet source compensation. The PVD chamber also includes an upper electromagnet assembly exterior to the chamber body in close proximity to the source, a magnetron assembly in the source including dual magnets with dual radius trajectories, a shield within the chamber body, and a plurality of grounding loops that are symmetrically spaced about a periphery of a substrate support assembly and are configured to provide an RF ground return path between the substrate support assembly and the shield.

20 Claims, 5 Drawing Sheets

(51) Int. Cl.
*C23C 14/56* (2006.01)
*H01L 21/768* (2006.01)
*C23C 14/50* (2006.01)
*C23C 14/35* (2006.01)

(58) Field of Classification Search
CPC ............ H01J 37/32651; H01J 37/3447; H01J 37/3441; H01L 21/76898
See application file for complete search history.

(56) References Cited

U.S. PATENT DOCUMENTS

| | | |
|---|---|---|
| 7,416,979 B2 | 8/2008 | Yoon et al. |
| 8,512,526 B2 | 8/2013 | Brown et al. |
| 8,696,875 B2 | 4/2014 | Ding et al. |
| 2002/0104751 A1 | 8/2002 | Drewery et al. |
| 2004/0094402 A1* | 5/2004 | Gopalraja ............... C23C 14/35 204/192.12 |
| 2006/0219172 A1* | 10/2006 | Kuo ........................ C23C 14/50 118/728 |
| 2007/0102286 A1* | 5/2007 | Scheible ............ H01J 37/3447 204/298.01 |
| 2007/0193982 A1* | 8/2007 | Brown .............. H01J 37/32706 219/121.43 |
| 2008/0099329 A1* | 5/2008 | Pavloff ............... H01J 37/3452 204/298.16 |
| 2011/0240466 A1 | 10/2011 | Ritchie et al. |
| 2013/0319854 A1* | 12/2013 | Parkhe ............. H01J 37/32577 204/298.06 |
| 2015/0357171 A1* | 12/2015 | Tang ...................... C23C 14/35 204/192.12 |
| 2017/0253959 A1* | 9/2017 | Wang .................. H01J 37/3447 |
| 2017/0316942 A1* | 11/2017 | Lai .................... H01J 37/32449 |
| 2018/0142342 A1 | 5/2018 | Yoshidome et al. |

\* cited by examiner

METHODS AND APPARATUS FOR EXTENDED CHAMBER FOR THROUGH SILICON VIA DEPOSITION

FIELD

Embodiments of the present principles generally relate to manufacturing of semiconductor devices.

BACKGROUND

Semiconductor devices are generally fabricated on a substrate as integrated circuits with various conductive layers that are interconnected to one another to facilitate propagation of signals within the device. In some instances, the devices are interconnected by vias or electrical connections that provide connections through different layers of the integrated circuits. Vias that are formed in silicon material are called through silicon vias or TSVs. As the complexity of the circuits increases, the size of the semiconductor structures decreases to allow more structures per given area. More and more layers are also incorporated to increase the density of the integrated circuits. The high density forces the TSVs to become smaller in diameter and at the same time the increase in the number of layers requires the depth of the TSVs to dramatically increase. The inventors have found that due to the small diameter sizes and the increased depth of the TSVs, barrier layer materials, such as tantalum, are not sputtered uniformly on the sides and bottoms of the TSVs in physical vapor deposition (PVD) chambers.

Thus, the inventors have provided improved an improved PVD chamber to uniformly deposit materials on high aspect ratio TSV structures.

SUMMARY

Methods and apparatus for forming uniform barrier layers in through silicon via (TSV) structures are provided herein.

In some embodiments, an apparatus for deposition of tantalum film on TSVs may comprise a PVD process chamber with a source and a chamber body including a processing volume, the PVD process chamber has a wafer-to-target distance of approximately 400 millimeters and the source is configured to provide dual magnet source compensation, a first electromagnet assembly exterior to the chamber body in closer proximity to the source of the process chamber than a substrate support assembly of the process chamber, a magnetron assembly in the source including dual magnets, a first magnet of the dual magnets rotates about a central axis at a first radius and a second magnet of the dual magnets rotates about the central axis at a second radius, wherein the first radius is greater than the second radius, a shield within the chamber body, and a plurality of grounding loops that are symmetrically spaced about a periphery of a substrate support assembly, the plurality of grounding loops configured to provide an RF ground return path between the substrate support assembly and the shield.

In some embodiments, the apparatus may further include a DC power source configured to supply approximately 38 kW to approximately 60 kW of DC power to a target of the source, wherein the DC power source is configured to supply approximately 42 kW to approximately 60 kW of DC power to the target of the source, an RF power source configured to supply greater than 0 kW to approximately 3 kW of RF bias power to the substrate support assembly, wherein the RF power source is configured to supply approximately 1.9 kW of RF bias power to the substrate support assembly, wherein the RF power source supplies RF bias power at a frequency of approximately 13.65 MHz, wherein the plurality of grounding loops includes approximately 9 grounding loops, wherein the first electromagnet assembly is configured to operate with 24 amps of power, a deposition ring with a cavity of approximately 0.450 inches wide and approximately 0.120 inches below an upper most surface of the substrate support assembly, wherein the PVD chamber is configured to deposit tantalum at a deposition rate of approximately 25 angstroms per second with a sheet resistivity nonuniformity percentage of less than approximately 5 percent, and/or a second electromagnet assembly exterior to the chamber body below the first electromagnet assembly and in closer proximity to the substrate support assembly of the process chamber than to the source of the process chamber.

In some embodiments, an apparatus for deposition of film on a wafer may comprise a PVD process chamber configured to deposit tantalum on structures, wherein the PVD process chamber has a source and a chamber body including a processing volume and a wafer-to-target distance of approximately 400 millimeters, and wherein the source is configured to provide dual magnet source compensation, a first electromagnet assembly exterior to the chamber body in closer proximity to the source of the process chamber than a substrate support assembly of the process chamber, wherein the first electromagnet assembly is configured to operate at 24 amps of current, a magnetron assembly in the source including dual magnets, a first magnet of the dual magnets rotates about a central axis at a first radius and a second magnet of the dual magnets rotates about the central axis at a second radius, wherein the first radius is greater than the second radius, a shield within the chamber body, and approximately nine grounding loops that are symmetrically spaced about a periphery of a substrate support assembly, the approximately nine grounding loops configured to provide an RF ground return path between the substrate support assembly and the shield when the substrate support assembly is in a processing position.

In some embodiments, the apparatus may further include a DC power source configured to supply approximately 38 kW to approximately 60 kW of DC power to a target of the source, an RF power source configured to supply greater than 0 kW to approximately 3 kW of RF bias power to the substrate support assembly at a frequency of approximately 13.65 MHz, a deposition ring with a cavity of approximately 0.450 inches wide and approximately 0.120 inches below an upper most surface of the substrate support assembly, and/or a second electromagnet assembly exterior to the chamber body below the first electromagnet assembly and in closer proximity to the substrate support assembly of the process chamber than to the source of the process chamber.

In some embodiments, an apparatus for deposition of film on a wafer may comprise a PVD process chamber configured to deposit tantalum on TSV structures, wherein the PVD process chamber has a source and a chamber body including a processing volume and a wafer-to-target distance of approximately 400 millimeters, and wherein the source is configured to provide dual magnet source compensation; a DC power source configured to supply approximately 38 kW to approximately 60 kW of DC power to a target of the source; a first electromagnet assembly exterior to the chamber body in closer proximity to the source of the process chamber than a substrate support assembly of the process chamber, wherein the first electromagnet assembly is configured to operate at 24 amps of current; a second electromagnet assembly exterior to the chamber body below the first electromagnet assembly and in closer proximity to the substrate support assembly of the process chamber than to the source of the process chamber; a magnetron assembly in the source including dual magnets, a first magnet of the dual magnets rotates about a central axis at a first radius and a second magnet of the dual magnets rotates about the central axis at a second radius, wherein the first radius is greater than the second radius; a shield within the chamber body; approximately nine grounding loops that are symmetrically spaced about a periphery of a substrate support assembly, the approximately nine grounding loops configured to provide an RF ground return path between the substrate support assembly and the shield when the substrate support assembly is in a processing position; a deposition ring surrounding the substrate support assembly with a cavity of approximately 0.350 inches to approximately 0.550 inches wide and approximately 0.050 inches to approximately 0.200 inches below an upper most surface of the substrate support assembly; and an RF power source configured to supply greater than 0 kW to approximately 3 kW of RF bias power to the substrate support assembly.

In some embodiments, the apparatus may further include wherein the DC power source is configured to supply approximately 42 kW to approximately 60 kW of DC power to the target of the source, wherein the RF power source is configured to supply approximately 1.9 kW of RF bias power to the substrate support assembly, and/or wherein the RF power source supplies RF bias power at a frequency of approximately 13.65 MHz.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for forming barrier layers in through silicon vias (TSVs) leverage a unique physical vapor deposition (PVD) chamber to enable high aspect ratio structure depositions with increased step coverage. The PVD chamber of the present principles provides a longer wafer-to-target spacing architecture with additional electromagnet control for enhanced PVD tantalum coverage on TSV structures with enhanced film uniformity. The longer target-to-wafer spacing reduces the amount of neutral atoms reaching the wafer and any overhang while producing a high ionization fraction that results in better step coverage performance. The longer spacing allows more control for directing ions and energy tuning, resulting in better on wafer performance. The PVD chamber may also include both lower and upper electromagnets surrounding the chamber body. The additional upper electromagnets assist in guiding ions that normally would be lost on chamber shields towards the wafer to produce more ions on wafer and better non-uniformity percentage (NU %) control.

As the classic Moore's law scaling slows, the semiconductor industry is looking towards new vertical scaling paradigms to drive improvements in power, performance, and cost. TSVs are an integral 3D Packaging enabler and scaling of TSV aspect ratios from 5×50 um to 3×50 um challenges PVD coverage and PVD's ability to achieve continuous barrier and seed layers on the TSVs. The smaller diameters and higher aspect ratios result in a need for thicker PVD films which increase cost and allow competition from alternative non-PVD metallization approaches. The PVD chamber of the present principles improves tantalum barrier step coverage by over two times without any compromises to the throughput and film performance. The PVD chamber of the present principles enables cost effective TSV metallization for next generation TSVs and enables larger market adoption of 3D packaging.

In some embodiments, the PVD chamber of the present principles includes an approximately 400 mm target-to-wafer spacing for neutral atom reduction on wafer surfaces and better step coverage, and/or additional upper electromagnets surrounding the chamber. In some embodiments, the PVD chamber includes enhanced grounding for RF bias current return for more uniform depositions, a deposition ring with enhanced deposition control, and/or a two-position magnetron assembly with an inner and outer radius track for increased deposition rate and coverage. In some embodiments, the PVD chamber includes higher DC power to improve coverage and deposition rate, higher RF bias to maintain a constant high ion energy, and/or a dual direction magnet source compensation (MSC) source with a center water feed to enable stable deposition rates as targets erode.

Figure 1:
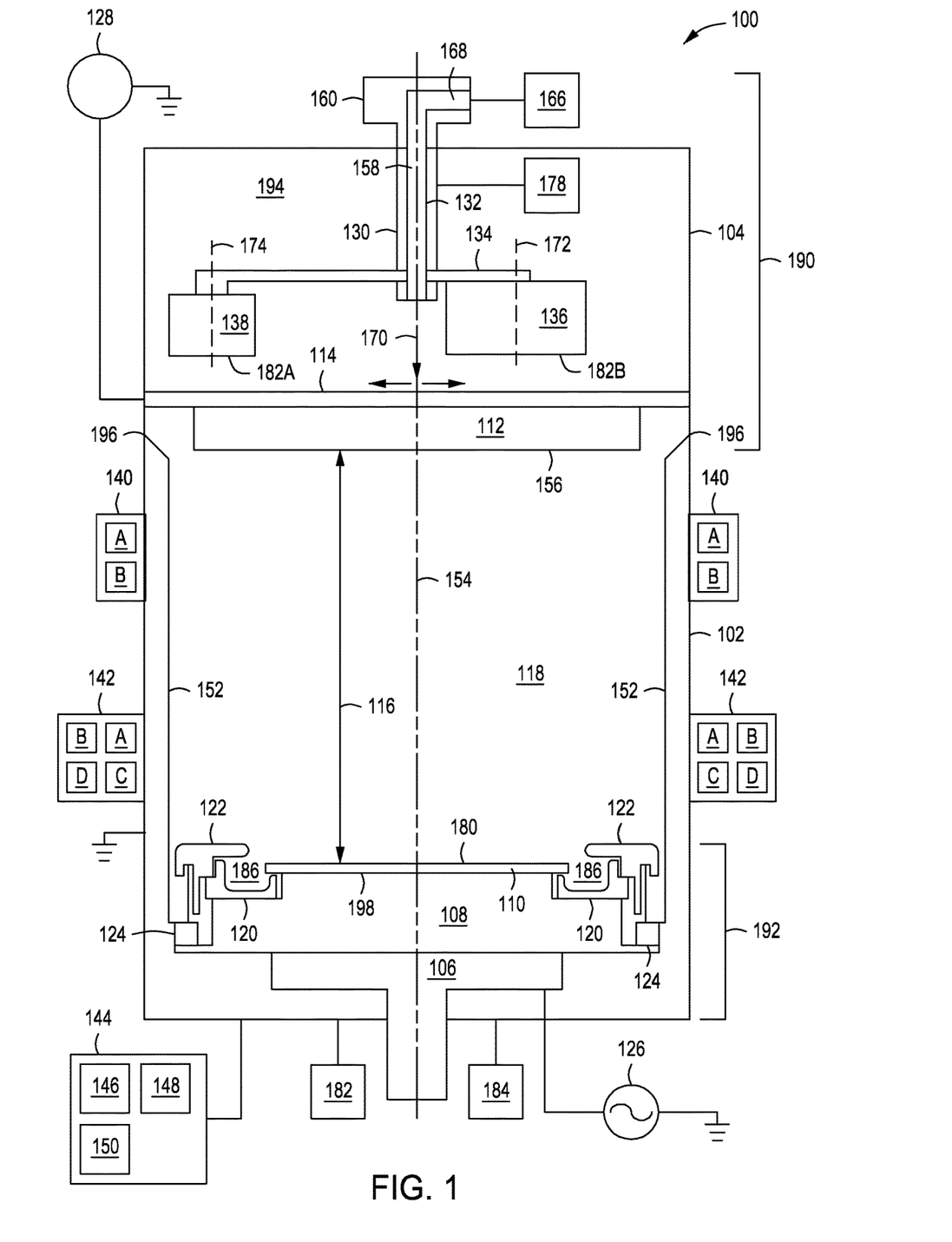
FIG. 1 depicts a schematic cross-sectional view of a PVD chamber in accordance with some embodiments of the present principles.

FIG. 1 is a cross-sectional view of a PVD chamber 100 according to some embodiments. The PVD chamber 100 may be used for the deposition of tantalum and other materials onto a wafer 110 which may contain semiconductor structures such as TSVs and the like. In some embodiments, the PVD chamber 100 may provide a deposition rate of approximately 25 angstroms per second using 50 kW of DC power and approximately 1.9 kW of RF bias power while achieving a less than approximately 5 percent sheet resistivity (Rs) NU %. The PVD chamber 100 includes a chamber body 102 and a source 190 that includes a magnetron assembly 104 and a target 112. The wafer 110 is supported on substrate support assembly 192 that includes an electrostatic chuck (ESC) 108 which is supported by a substrate support pedestal 106. One or more gases may be supplied from a gas source 184 into a lower part of the PVD chamber 100. A pump 182 is connected to the PVD chamber 100 for exhausting the interior of the PVD chamber 100 and to facilitate maintaining a desired pressure inside the PVD chamber 100.

At the top of a processing volume 118, is the target 112 with a backing plate 114. In some embodiments, in order to reduce the amount of neutral atoms reaching the wafer 110, the distance 116 between a lowermost surface 156 of the target 112 and a top surface 180 of the wafer 110 is approximately 400 mm. The 400 mm spacing provides improved gap fill on TSV structures. In some embodiments, the distance 116 is approximately 300 mm to approximately 500 mm. In some embodiments, the distance 116 is approximately 350 mm to approximately 450 mm. In some embodiments, the distance 116 is approximately 375 mm to approximately 425 mm. In some embodiments, the target 112 may be titanium, tantalum, tungsten, or the like. A DC power source 128 provides DC power to the target 112 via the backing plate 114 to sputter the target 112 during processing. The backing plate 114 may comprise a conductive material, such as copper-zinc, copper-chrome, or the same material as the target 112, such that DC power can be coupled to the target 112 via the backing plate 114. Alternatively, the backing plate 114 may be non-conductive and may include conductive elements (not shown) such as electrical feedthroughs or the like. The backing plate 114 may be disc shaped, rectangular, square, or any other shape that may be accommodated by the PVD chamber 100. The backing plate 114 is configured to support the target 112 such that a front surface of the target 112 opposes the wafer 110 when present. The target 112 may be coupled to the backing plate 114 in any suitable manner. For example, in some embodiments, the target 112 may be diffusion bonded to the backing plate 114.

The magnetron assembly 104 includes a first magnet 136 that travels in a first radius over the target 112 about a central axis 154 and a second magnet that travels in a second radius over the target 112 about the central axis 154. The first radius may be referred to as the inner radius and the second radius may be referred to as the outer radius. A support apparatus 134 supports the first magnet 136 and the second magnet 138 and enables the first magnet 136 and the second magnet 138 to rotate around a central axis 154. In some embodiments, the first magnet 136 may rotate about a first magnet axis 172 and/or the second magnet 138 may rotate about a second magnet axis 174. In some embodiments, the first magnet 136 and/or the second magnet 138 may comprise a plurality of individual magnets.

In TSV applications, the deposition rate decreases over the target life which also decreases the throughput of a process chamber. To keep the deposition rate constant through the target life, the target voltages are kept constant. Target voltages can be controlled by moving the magnets in a vertical or Z direction. The source 190 of the PVD chamber 100 has a dual position magnetron that can advantageously improve cooling using centrally fed coolant that ensures a constant deposition rate by keeping the distance between the lowermost surfaces 182A, 182B of the magnets of the magnetron assembly 104 and the lowermost surface 156 of the sputtering target constant during deposition processes. The dual magnet source compensation (MSC) of the source 190 advantageously alleviates cracking and/or bowing of the target due to overheating and decreases in the deposition rate over the life of the target. The magnetron assembly 104 has two magnet positions (an outer radial position of the second magnet 138 and an inner radial position of the first magnet 136), enabling a change in the magnetic field at the sputtering target surface by the reconfiguration of the magnet poles in the different positions. As such, target utilization is further improved because the center and periphery of the target are both sputtered.

In some embodiments, the magnetron assembly 104 is capable of vertical movement (Z direction) to control the distance from the first magnet 136 and second magnet 138 to the lowermost surface 156 (wafer facing surface) of the target 112 to ensure that the distance remains substantially constant. In some embodiments, the vertical motion is supplied by one or more motor assemblies 178. The dual MSC source uses a center coolant feed 132 to maximize the target life. Conventionally supplied coolant feed structures supply coolant from a side of a cavity 194 of the magnetron assembly 104. However, because coolant flowing to the portion of the target 112 immediately beneath the first magnet 136 and the second magnet 138 is obstructed by the first magnet 136 and the second magnet 138, the portion of the target 112 immediately beneath the first magnet 136 and the second magnet 138 does not receive a sufficient amount of coolant. As a result, as the magnetron assembly 104 rotates, the area within which the first magnet 136 and the second magnet 138 moves over becomes excessively hot, sometimes reaching up to 400° C. A resulting temperature gradient is formed between portions of the target 112 that are sufficiently cooled and portions that are not sufficiently cooled. The temperature gradient leads to target cracking and/or bowing.

To keep the target 112 at a temperature less than about 200° C., the center coolant feed 132, which supplies coolant to a center of the target 112 (i.e., along the central axis 154. The center coolant feed 132 extends through a body portion 130 along the central axis 154. The center coolant feed 132 and includes a central channel 158 extending along the central axis 154 from a manifold portion 160 through a body portion 130. A coolant supply 166 is fluidly coupled to an inlet 168 of the manifold portion 160 to supply a coolant through the center coolant feed 132 and into the cavity 194. The center coolant feed 132 extends through the body portion 130 along the central axis 154 to supply a coolant (as shown by flow lines 170) to the cavity 194 at a center of the target 112. As a result, a more uniform flow of coolant is advantageously achieved, thus substantially reducing or eliminating the temperature gradient across the target 112, reducing cracking and bowing of the target. After entering the cavity 194 through the center coolant feed 132, the coolant subsequently flows out of the cavity 194 through an opening (not shown) formed in an outlet (not shown) disposed in a top of the cavity. A return line (not shown) is coupled to the outlet to receive the coolant after the coolant has flowed through the cavity 194.

An RF bias power source 126 may be coupled to the substrate support assembly 192 in order to induce a negative DC bias on the wafer 110. In addition, in some embodiments, a negative DC self-bias may form on the wafer 110 during processing. For example, RF energy supplied by the RF bias power source 126 may range in frequency from about 2 MHz to about 60 MHz, for example, non-limiting frequencies such as 2 MHz, 13.56 MHz, or 60 MHz can be used. In some embodiments, the RF power may be supplied in a range from approximately 1 kW to about 20 kW. In some embodiments, the RF power supplied may be approximately 3 kW. In some embodiments, the RF power supplied may be approximately 1.9 kW. In some embodiments, DC power may be supplied to the target 112 from a DC power source 128 in a range from approximately 38 kW to approximately 50 kW. In some embodiments, the DC power source 128 may provide DC power in range from approximately 42 kW to approximately 50 kW. In some embodiments, the DC power source 128 may provide DC power in range from approximately 42 kW to approximately 60 kW. In some embodiments, the DC power source 128 may provide DC power in range from approximately 38 kW to approximately 60 kW. In other applications, the substrate support assembly 192 may be grounded or left electrically floating.

The PVD chamber 100 further includes a process kit shield or shield 152 to surround the processing volume 118 of the PVD chamber 100 and to protect other chamber components from damage and/or contamination from processing. In some embodiments, the shield 152 may be grounded at an uppermost point 196 to the chamber body to provide an RF ground return path. The shield 152 extends downwardly and may include a generally tubular portion having a generally constant diameter that generally surrounds the processing volume 118. The shield 152 extends along the walls of the chamber body 102 downwardly to below an uppermost surface 198 of an ESC 108 and returns upwardly until reaching a cover ring 122 (e.g., forming a u-shaped portion at the bottom of the shield 152). The cover ring 122 rests on the top of an upwardly extending inner portion of the shield 152 when the substrate support assembly 192 is in a lower, loading position but rests on the outer periphery of a deposition ring 120 when in an upper, deposition position to protect the substrate support assembly 192 from sputter deposition. The deposition ring 120 may be used to protect the edges of the substrate support assembly 192 including substrate support pedestal and/or the ESC 108 from deposition around the edge of the wafer 110. In some embodiments, the deposition ring 120 has a large deposition cavity 186 that allows more deposition buildup before the deposition ring 120 needs to be replaced.

In some embodiments, a lower magnet assembly 142 may be disposed about the PVD chamber 100 for selectively providing a magnetic field between the ESC 108 and the target 112. For example, the lower magnet assembly 142 may be disposed about the exterior of the chamber body 102 in a region just above the ESC 108 when the substrate support assembly 192 is in a processing position. In some embodiments, an upper magnet assembly 140 may be disposed around the chamber body 102 in closer proximity to the target 112 than the ESC 108 (above the lower magnet assembly 142 when present). The lower magnet assembly 142 and/or the upper magnet assembly 140 may be an electromagnet and may be coupled to a power source (not shown) for controlling the magnitude of the magnetic field generated by the electromagnet. The electromagnets produce magnetic B-fields that allow control of the ion direction and energies. The addition of the upper magnet assembly 140 allows for control of the ion direction and energies with higher accuracies than with the lower magnet assembly 142 alone. The higher accuracies allow for improvement in step coverage (deposition inside TSVs) of TSV structures.

The lower magnet assembly 142 and/or the upper magnet assembly 140 may be coupled to a coolant source (not shown, see, e.g., FIG. 2) for controlling the temperature generated by operation of the electromagnet. In some embodiments, the upper magnet assembly 140 is supplied with approximately 24 amps of current which flows through a top magnet 140A and a bottom magnet 140B that are electrically connected in series. In some embodiments, the upper magnet assembly 140 is supplied with approximately 20 amps to approximately 30 amps of current. In some embodiments, the lower magnet assembly 142 is supplied with approximately 4 amps for a bottom inner magnet 142C and approximately −4 amps for a top inner magnet 142A and a top outer magnet 142B when the PVD chamber 100 is using an inner radius of the magnetron assembly 104 for sputtering the target 112. In some embodiments, the lower magnet assembly 142 is supplied with approximately 5 amps for the bottom inner magnet 142C and approximately −4 amps for the top inner magnet 142A and the top outer magnet 142B when the PVD chamber 100 is using an outer radius of the magnetron assembly 104 for sputtering the target 112. In some embodiments, a bottom outer magnet 142D is not used.

Substrate processing systems using RF generated plasmas, require a return path for RF currents generated during processing back to a source, such as the RF power source that supplied the current. In some cases, the return path may include the current traveling through a substrate support (e.g., ESC) along a floor of the processing system and then ultimately along a wall and/or shield of the processing system back to the source. When operating under certain processing conditions, arcing between chamber components, such as between the substrate support assembly 192 (including the ESC 108 and/or substrate support pedestal 106) and adjacent chamber components, and/or stray plasma can undesirably occur, leading to component damage and/or generation of particles that can further undesirably contaminate a substrate disposed in the chamber. Inside the processing volume 118, the process kit and shield 152 are grounded to the chamber body 102 and provide the main return for the plasma current.

In some embodiments, the PVD chamber 100 may include one or more grounding loops 124 that electrically connect the substrate support assembly 192 (e.g., the ESC 108 and/or substrate support pedestal 106) to the shield 152. The grounding loops 124 are loops that compress to provide contact with the shield 152 when the substrate support assembly 192 is in a raised process position. The inventors have discovered that irregular spacing and/or insufficient numbers of grounding loops cause uniformity issues with depositions on the wafer 110. The inventors discovered that if the grounding loops are spaced evenly around the outer perimeter of the substrate support assembly 192 (e.g., the ESC 108 and/or the substrate support pedestal 106) in a sufficient quantity, the deposition uniformity is improved. The improvement in deposition uniformity stems from the RF ground return points being evenly dispersed. When RF ground return points are uneven, the irregular current flow pattern is mirrored on film deposited on the wafer 110. In some embodiments, a symmetric dispersal of approximately nine grounding loops around the periphery of the substrate support assembly 192 (e.g., the ESC 108 and/or the substrate support pedestal 106) provided an optimal number and spacing for enhanced uniformity of the deposition on the wafer 110.

A controller 144 may be provided and coupled to various components of the PVD chamber 100 to control the operation thereof. The controller 144 includes a central processing unit (CPU) 146, a memory 148, and support circuits 150. The controller 144 may control the PVD chamber 100 directly, or via computers (or controllers) associated with particular process chamber and/or support system components. The controller 144 may be one of any form of general-purpose computer processor that can be used in an industrial setting for controlling various chambers and subprocessors. The memory, or computer readable medium, 148 of the controller 144 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 150 are coupled to the CPU 146 for supporting the processor in a conventional manner. These circuits include cache, power supplies, clock circuits, input/output circuitry and subsystems, and the like. Methods to control the PVD chamber 100 and/or processes may be stored in the memory 148 as software routine that may be executed or invoked to control the operation of the PVD chamber 100 in the manner described herein. The software routine may also be stored and/or executed by a second CPU (not shown) that is remotely located from the hardware being controlled by the CPU 146.

Figure 2:
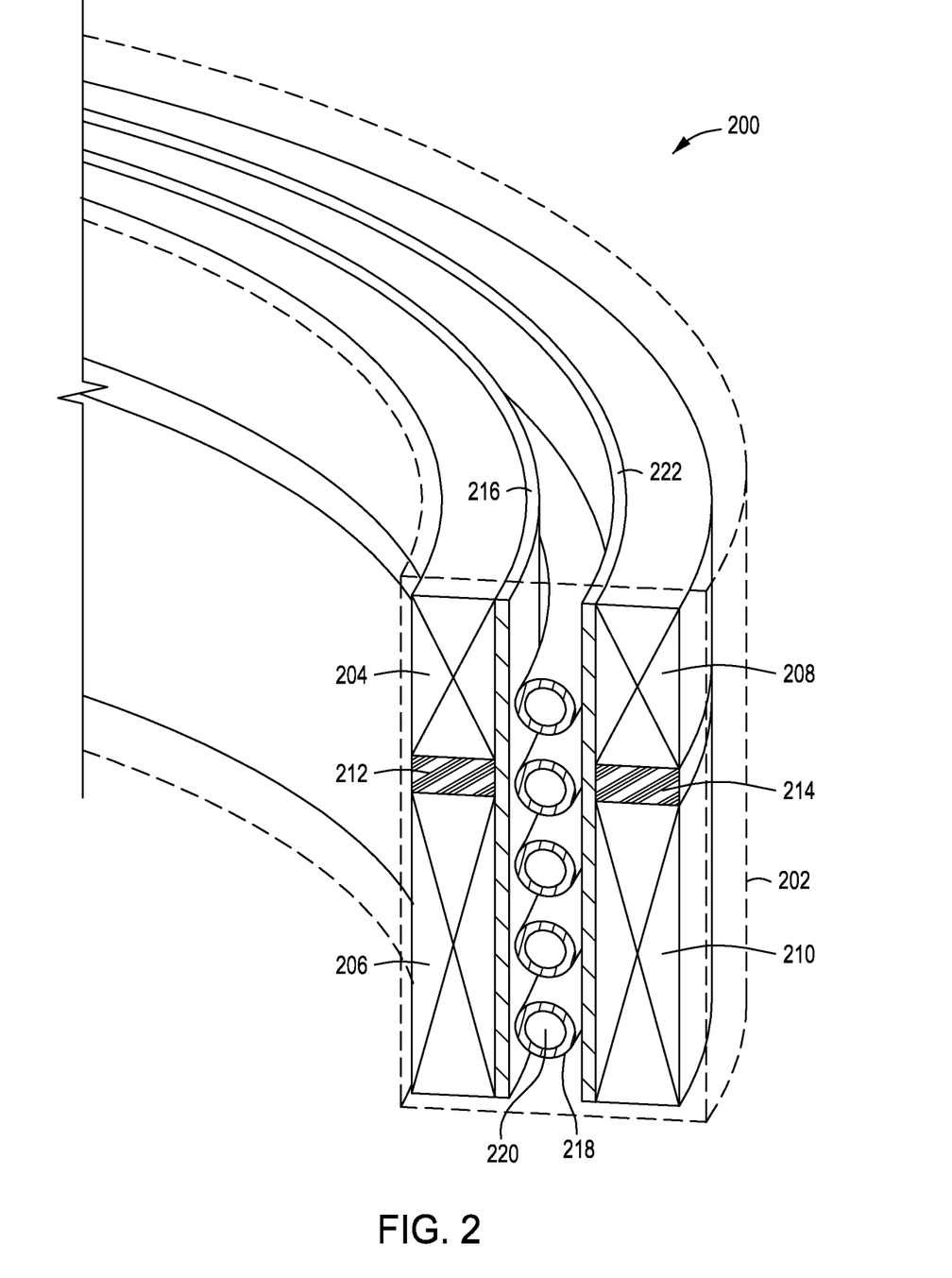
FIG. 2 depicts a cross-sectional isometric view of a portion of an electromagnet assembly in accordance with some embodiments of the present principles.

FIG. 2 depicts a cross-sectional view of an electromagnet assembly 200 in accordance with some embodiments. The electromagnet assembly 200 may be used as the lower magnet assembly 142 and/or the upper magnet assembly 140. In some embodiments, the electromagnet assembly 200 may have only two windings or coils for use as the upper magnet assembly 140. The electromagnet assembly 200 is depicted with an encapsulant 202 for electrical isolation in phantom lines. The electromagnet coils 204, 206, 208, 210 include multiple turns of magnet wire in both the vertical and radial directions arranged with a generally rectangular cross section. The magnet wire is typically composed of copper and is insulatively coated. In some embodiments, the magnet wire has a square cross section. The electromagnet coils 204, 206, 208, 210 are wound on cylindrical aluminum mandrels of differing diameters to account for the differing diameters of the inner electromagnet coils 204, 206 and outer electromagnet coils 208, 210. Although the number of turns in the coils may be varied, in some embodiments, the number of turns includes 7×14 turns for the upper electromagnet coils 204, 208 and 7×26 turns for the lower electromagnet coils 206, 210. The inner electromagnet coils 204, 206 may be wound together on the same mandrel with a washer-shaped inner spacer 212 vertically separating them. Similarly, the outer electromagnet coils 208, 210 can be wound together on another mandrel with a washer-shaped outer spacer 214 vertically separating them. Both spacers 212, 214 are preferably formed of a non-magnetic dielectric such as G-10, a glass filled resin. Between windings of different layers of the electromagnet coils 204, 206, 208, 210, the magnet wire is painted with a thin, quick drying epoxy resin. The cured epoxy is thermally conductive and binds the magnet wire into respective free-standing electromagnet coils 204, 206, 208, 210. The two ends of the magnet wire extend away from the wound electromagnet coils to provide for later electrical connection.

A tubular inner shim 216 of aluminum is placed outside of the assembled inner electromagnet coils 204, 206 and inner spacer 212. In some embodiments, a cooling coil 218 of tubing of non-magnetic 300 Series stainless steel and having multiple turns in a helix extending along the vertical direction is placed outside of the inner shim 216. All stainless-steel components are solution annealed to remove any residual magnetic characteristics. The cooling coil 218 contains a central axial passageway 220 for the circulation of cooling fluid. The cooling coil 218 is pre-wound on a mandrel to a slightly larger diameter and is tightened around the circumference of the inner shim 216. A tubular outer shim 222 of aluminum is placed outside the cooling coil 218. The shims 216, 222 are useful for facilitating thermal flow between the electromagnetic coils 204, 206, 208, 210 and the cooling coil 218 and controlling the radial dimensions of the electromagnet assembly 200. The two outer electromagnet coils 208, 210 and outer spacer 214 are assembled around the circumference of the outer shim 222. The outer electromagnet coils 208, 210 are vertically aligned to the inner electromagnet coils 204, 206.

Figure 3:
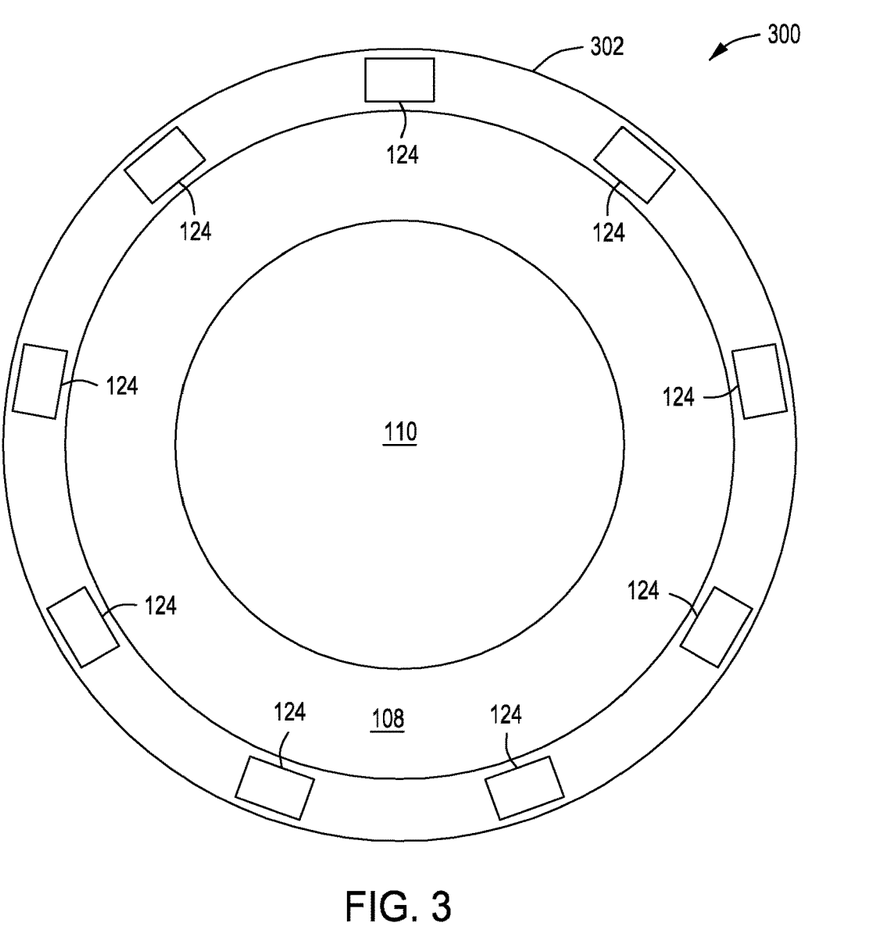
FIG. 3 depicts a top down view of grounding loops in accordance with some embodiments of the present principles.

FIG. 3 depicts a top down view 300 of grounding loops 124 in accordance with some embodiments. In some embodiments, the grounding loops 124 of FIG. 1 may be mounted on a flange assembly 302 of the ESC 108. In some embodiments, the grounding loops 124 may be mounted on a flange assembly of the substrate support pedestal 106 (not shown). The flange assembly 302 may be formed as a separate piece or as part of the ESC 108 or substrate support pedestal 106. The grounding loops 124 provide robust RF grounding to prevent arcing and unwanted stray plasma in the PVD chamber 100. The PVD chamber 100 has an RF voltage on top of the DC voltage during depositions on TSV structures. In order to provide uniform depositions, the RF return currents should return back to the cathode match and then back to the generator in a symmetric fashion. The ground loops 124 of the present principles reduces the tilt associated with asymmetric ground current return usually associated with higher RF frequencies and eliminates shield arcing associated with poor RF grounding. The grounding loops 124 provides an enhanced grounding scheme especially for chambers that require RF current return via a process kit.

The PVD chamber 100 uses very high-density plasma for TSV deposition which uses a significant amount of the power (with high currents) to create ion flux. In some cases, as much as 40A of current may pass through the ESC 108. The current should be returned back to the source via the grounded surface of the ESC 108. The inventors have found that using approximately 9 symmetrically spaced flexible loop straps (the grounding straps 124 as illustrated in FIG. 3) provides an efficient RF return path from the ESC 108 or substrate support pedestal 106 to the shield 152. The inventors also found that asymmetric grounding at the ESC 108 or substrate support pedestal 106 will generate asymmetric deposition on the wafer 110. By adjusting the number and spacing of the grounding loops 124, the film deposition uniformity can be used as a deposition uniformity tuning feature and adjusted such that a low film non-uniformity is achieved. The grounding loops 124 advantageously prevent the generation of particles from stray plasma that can undesirably contaminate wafers which lead to film nonuniformity and reduce deposition asymmetry on the wafer which improves film uniformity. The grounding loops 124 also prevent arcing between the ESC and/or substrate support assembly and the process kit shield under process conditions with higher currents (e.g., 40 amps or higher), high RF (e.g., 40 MHz or higher), and/or higher power levels (e.g., 6 kW or higher) with high pressures (e.g., approximately 60-140 mTorr). The grounding loops 124 also beneficially provide a low impedance return path for RF currents generated during processing which are desirable for TSV processes.

Figure 4:
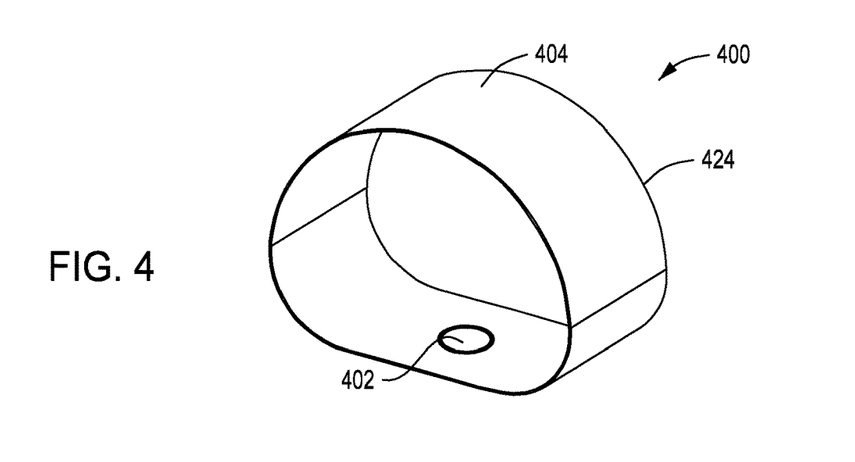
FIG. 4 depicts an isometric view of a grounding loop in accordance with some embodiments of the present principles.
Figure 5:
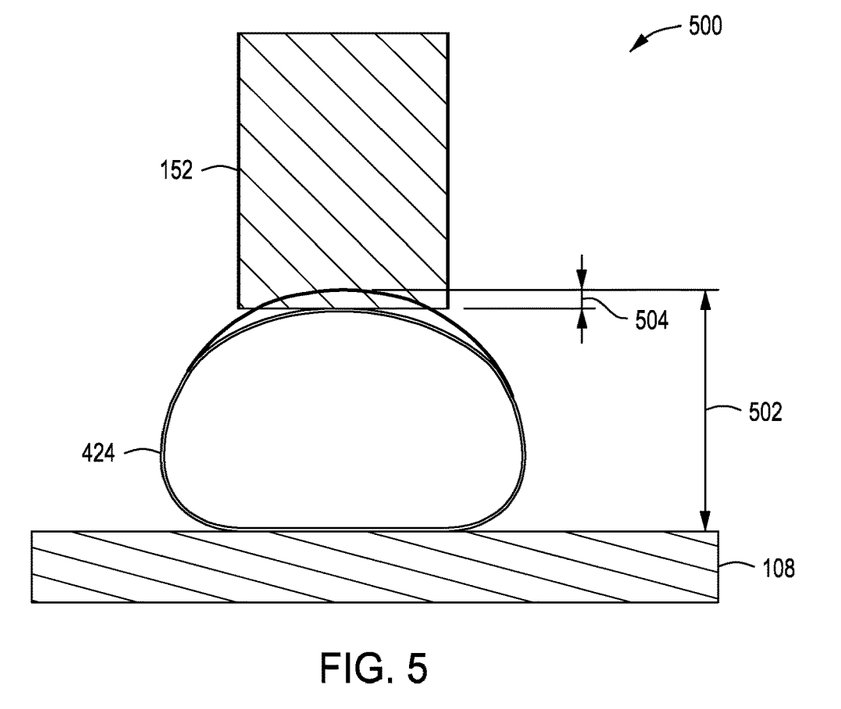
FIG. 5 is a side view of ground loop compression in accordance with some embodiments of the present principles.

FIG. 4 depicts an isometric view 400 of a grounding loop 424 in accordance with some embodiments. The grounding loop 424 is representative of one of the grounding loops 124. The grounding loop 424 is a conductive flexible loop with a lower mount 402 that allows the grounding loop 424 to be attached to a surface to provide a first electrical connection. The upper surface 404 provides a second electrical connection when the upper surface 404 comes into contact with another surface. FIG. 5 is a side view 500 of grounding loop compression in accordance with some embodiments. The grounding loop 424 is shown in-situ in the PVD chamber 100. The grounding loop 424 is mounted to a flange of the ESC 108 (or substrate support pedestal 106 in some embodiments) and is in compressed electrical contact with the shield 152, allowing an RF return current to flow through the grounding loops 424. A first height 502 of the grounding loop 424 may be compressed by the shield 152 to a second height 504. The amount of compression (first height 502 minus second height 504) may be noted as a percentage of the first height 502. In some embodiments, the grounding loop 424 may have a compression of approximately 10% to approximately 50%. The amount of force required for compression should be less than the force required to dislodge the shield 152 from the shield's normal position from within the PVD chamber 100.

Figure 6:
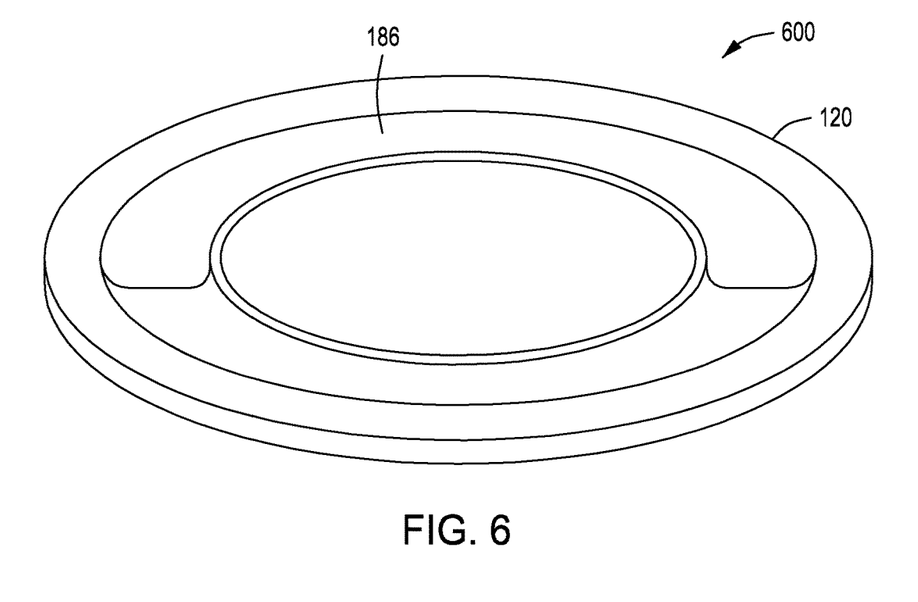
FIG. 6 is an isometric view of a deposition ring in accordance with some embodiments of the present principles.
Figure 7:
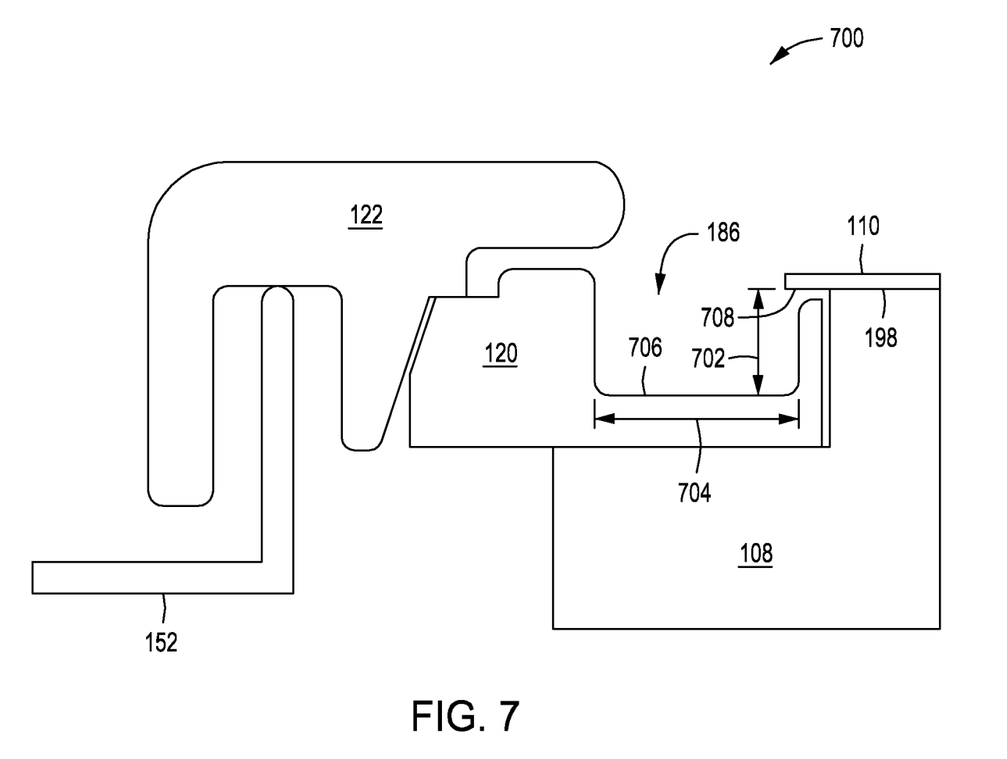
FIG. 7 depicts a cross-sectional side view of a deposition ring in accordance with some embodiments of the present principles.

FIG. 6 is an isometric view 600 of the deposition ring 120 in accordance with some embodiments. The deposition ring 120 surrounds the ESC 108 and prevents unwanted stray plasma and depositions on or near the ESC 108 and/or substrate support pedestal 106. The deposition ring 120 has a large deposition cavity 186 that permits more deposition deposits to buildup, increasing the maintenance interval and reducing wafer arcing during high voltage TSV deposition processes. FIG. 7 depicts a cross-sectional view 700 of the deposition ring 120 in accordance with some embodiments. The deposition ring 120 is interposed between the ESC 108 and the cover ring 122 which interfaces with the shield 152. In some embodiments, the large deposition cavity 186 is approximately 0.350 inches to approximately 0.550 inches in width denoted by a first distance 704 and approximately 0.050 inches to approximately 0.200 inches in height measured from a lower surface 706 of the large deposition cavity 186 to the uppermost surface 198 of the ESC 108 and/or a bottom surface 708 of the wafer 110 denoted by a second distance 702. In some embodiments, the large deposition cavity 186 is approximately 0.450 inches wide by approximately 0.120 inches high. In some embodiments, the large deposition cavity 186 may be coated on upper surfaces with aluminum oxide (also known as alumina) via arc spray processes.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for deposition of tantalum film on through silicon vias (TSV), comprising:
a physical vapor deposition (PVD) process chamber with a source with dual magnets positioned above a top of a processing volume and a chamber body including the processing volume, wherein the PVD process chamber has a wafer-to-target distance of approximately 350 to approximately 450 millimeters, wherein the source is configured to move the dual magnets of the source in a vertical direction to constantly maintain a distance between bottom surfaces of the dual magnets and a bottom surface of a target when present, wherein the PVD process chamber is configured to improve step coverage of tantalum deposited inside of TSV structures, and wherein the PVD process chamber is configured to reduce an amount of neutral atoms reaching an uppermost surface of a substrate support assembly in the PVD process chamber;
a first electromagnet assembly exterior to the chamber body in closer proximity to the source of the process chamber than a substrate support assembly of the process chamber;
a magnetron assembly in the source including the dual magnets, a first magnet of the dual magnets rotates about a central axis at a first radius and a second magnet of the dual magnets rotates about the central axis at a second radius, wherein the first radius is greater than the second radius;
a shield within the chamber body;
a plurality of grounding loops that are symmetrically spaced about a periphery of the substrate support assembly, the plurality of grounding loops configured to provide an RF ground return path between the substrate support assembly and the shield;
a second electromagnet assembly exterior to the chamber body below the first electromagnet assembly and in proximity of the substrate support assembly, wherein the second electromagnet assembly has inner and outer upper adjacent electromagnets and inner and outer lower adjacent electromagnets; and
a controller configured to adjust current individually through the inner and outer upper adjacent electromagnets and the inner and outer lower adjacent magnets based on whether the first radius is in use or the second radius is in use in the magnetron assembly.

2. The apparatus of claim 1, further comprising:
a DC power source configured to supply at least approximately 50 kW of DC power to the source.

3. The apparatus of claim 1, further comprising:
a coolant feed channel coaxially positioned about the central axis with an outlet positioned to first supply coolant beneath the dual magnets.

4. The apparatus of claim 1, further comprising:
an RF power source configured to supply greater than 0 kW to approximately 3 kW of RF bias power to the substrate support assembly.

5. The apparatus of claim 4, wherein the RF power source is configured to supply approximately 1.9 kW of RF bias power to the substrate support assembly.

6. The apparatus of claim 5, wherein the RF power source supplies RF bias power at a frequency of approximately 13.65 MHz.

7. The apparatus of claim 1, wherein the plurality of grounding loops includes approximately 9 grounding loops.

8. The apparatus of claim 1, wherein the first electromagnet assembly is configured to increase step coverage of the TSV structures and wherein the first electromagnet assembly is configured to operate with approximately 24 amps of power.

9. The apparatus of claim 1, further comprising:
a deposition ring with a cavity of approximately 0.450 inches wide and approximately 0.120 inches below an upper most surface of the substrate support assembly.

10. The apparatus of claim 1, wherein the PVD chamber is configured to deposit tantalum at a deposition rate of approximately 25 angstroms per second with a sheet resistivity nonuniformity percentage of less than approximately 5 percent.

11. The apparatus of claim 1, further comprising:
a DC power source connected to the source; and
an RF power source connected to the substrate support assembly, wherein the controller is further configured to deposit tantalum at rate of approximately 25 angstroms per second with a DC power of approximately 50 kW supplied to the source while an RF bias power of approximately 1.9 kW is supplied to the substrate support assembly to yield a sheet resistivity (Rs) nonuniformity percentage (NU %) of less than approximately 5%.

12. An apparatus for deposition of film on a wafer, comprising:
a physical vapor deposition (PVD) process chamber configured to improve step coverage of tantalum deposited inside of through silicon via (TSV) structures, wherein the PVD process chamber has a source with dual magnets positioned above a top of a processing volume and a chamber body including the processing volume and a wafer-to-target distance of approximately 350 to approximately 450 millimeters, wherein the source is configured to move the dual magnets of the source in a vertical direction to constantly maintain a distance between bottom surfaces of the dual magnets and a bottom surface of a target when present, and wherein the PVD process chamber is configured to reduce an amount of neutral atoms reaching an uppermost surface of a substrate support assembly in the PVD process chamber;
a first electromagnet assembly exterior to the chamber body in closer proximity to the source of the process chamber than a substrate support assembly of the process chamber, wherein the first electromagnet assembly is configured to operate at approximately 24 amps of current and wherein the first electromagnet assembly is configured to increase step coverage of the TSV structures;
a magnetron assembly in the source including the dual magnets, a first magnet of the dual magnets rotates about a central axis at a first radius and a second magnet of the dual magnets rotates about the central axis at a second radius, wherein the first radius is greater than the second radius;
a coolant feed channel coaxially positioned about the central axis with an outlet positioned to first supply coolant beneath the dual magnets;
a shield within the chamber body; and
approximately nine grounding loops that are symmetrically spaced about a periphery of the substrate support assembly, the approximately nine grounding loops configured to provide an RF ground return path between the substrate support assembly and the shield when the substrate support assembly is in a processing position.

13. The apparatus of claim 12, further comprising:
a DC power source configured to supply approximately 38 kW to approximately 60 kW of DC power to the source.

14. The apparatus of claim 12, further comprising:
an RF power source configured to supply greater than 0 kW to approximately 3 kW of RF bias power to the substrate support assembly at a frequency of approximately 13.65 MHz.

15. The apparatus of claim 12, further comprising:
a deposition ring with a cavity of approximately 0.450 inches wide and approximately 0.120 inches below an upper most surface of the substrate support assembly.

16. The apparatus of claim 12, further comprising:
a second electromagnet assembly exterior to the chamber body below the first electromagnet assembly and in proximity of the substrate support assembly, wherein the second electromagnet assembly has inner and outer upper adjacent electromagnets and inner and outer lower adjacent electromagnets; and
a controller configured to adjust current individually through the inner and outer upper adjacent electromagnets and the inner and outer lower adjacent magnets based on whether the first radius is in use or the second radius is in use in the magnetron assembly.

17. An apparatus for deposition of film on a wafer, comprising:
a physical vapor deposition (PVD) process chamber configured to improve step coverage of tantalum deposited inside of through silicon via (TSV) structures, wherein the PVD process chamber has a source with dual magnets positioned above a top of a processing volume and a chamber body including the processing volume and a wafer-to-target distance of approximately 350 to approximately 450 millimeters, wherein the source is configured to move the dual magnets of the source in a vertical direction to constantly maintain a distance between bottom surfaces of the dual magnets and a bottom surface of a target when present, and wherein the PVD process chamber is configured to reduce an amount of neutral atoms reaching an uppermost surface of a substrate support assembly in the PVD process chamber;
a DC power source configured to supply approximately 38 kW to approximately 60 kW of DC power to the source;
a first electromagnet assembly exterior to the chamber body in closer proximity to the source of the process chamber than a substrate support assembly of the process chamber, wherein the first electromagnet assembly is configured to increase step coverage of the TSV structures;
a magnetron assembly in the source including dual magnets, a first magnet of the dual magnets rotates about a central axis at a first radius and a second magnet of the dual magnets rotates about the central axis at a second radius, wherein the first radius is greater than the second radius;
a shield within the chamber body;
approximately nine grounding loops that are symmetrically spaced about a periphery of the substrate support assembly, the approximately nine grounding loops configured to provide an RF ground return path between the substrate support assembly and the shield when the substrate support assembly is in a processing position;
a deposition ring surrounding the substrate support assembly with a cavity of approximately 0.350 inches to approximately 0.550 inches wide and approximately 0.050 inches to approximately 0.200 inches below an upper most surface of the substrate support assembly;
an RF power source configured to supply greater than 0 kW to approximately 3 kW of RF bias power to the substrate support assembly;
a second electromagnet assembly exterior to the chamber body below the first electromagnet assembly and in proximity of the substrate support assembly, wherein the second electromagnet assembly has inner and outer upper adjacent electromagnets and inner and outer lower adjacent electromagnets; and a controller configured to adjust current individually through the inner and outer upper adjacent electromagnets and the inner and outer lower adjacent magnets based on whether the first radius is in use or the second radius is in use in the magnetron assembly.

18. The apparatus of claim 17, wherein the DC power source is configured to supply approximately 42 kW to approximately 60 kW of DC power to the source.

19. The apparatus of claim 17, wherein the RF power source is configured to supply approximately 1.9 kW of RF bias power to the substrate support assembly.

20. The apparatus of claim 17, wherein the RF power source supplies RF bias power at a frequency of approximately 13.65 MHz.

* * * * *

UNITED STATES PATENT AND TRADEMARK OFFICE
CERTIFICATE OF CORRECTION

| | | |
|---|---|---|
| PATENT NO. | : 11,846,013 B2 | Page 1 of 1 |
| APPLICATION NO. | : 16/945491 | |
| DATED | : December 19, 2023 | |
| INVENTOR(S) | : David Gunther et al. | |

It is certified that error appears in the above-identified patent and that said Letters Patent is hereby corrected as shown below:

In the Claims

In Column 12, Lines 15-16, Claim 1, delete "a substrate support assembly of the process chamber" and insert -- the substrate support assembly --

In Column 14, Lines 40-41, Claim 17, delete "a substrate support assembly of the process chamber" and insert -- the substrate support assembly --

Signed and Sealed this
Nineteenth Day of March, 2024

Katherine Kelly Vidal
*Director of the United States Patent and Trademark Office*